United States Patent [19]

Otsuki et al.

[11] Patent Number: 5,545,911
[45] Date of Patent: Aug. 13, 1996

[54] SEMICONDUCTOR DEVICE HAVING MOSFETS FORMED IN INHERENT AND WELL REGIONS OF A SEMICONDUCTOR SUBSTRATE

[75] Inventors: Kazutaka Otsuki; Masaaki Yamada, both of Tokyo, Japan

[73] Assignee: NEC Corporation, Japan

[21] Appl. No.: 350,696

[22] Filed: Dec. 7, 1994

[30] Foreign Application Priority Data

Dec. 17, 1993 [JP] Japan ..................................... 5-317986

[51] Int. Cl.⁶ ........................... H01L 29/76; H01L 29/80; H01L 29/94
[52] U.S. Cl. .......................... 257/376; 257/285; 257/398; 257/400
[58] Field of Search ..................................... 257/285, 376, 257/398, 400

[56] References Cited

U.S. PATENT DOCUMENTS

| 4,890,147 | 12/1989 | Teng et al. | 257/398 |
|---|---|---|---|
| 5,365,082 | 11/1994 | Gill et al. | 257/398 |
| 5,399,895 | 3/1995 | Koga | 257/376 |
| 5,440,165 | 8/1995 | Mitsunaga et al. | 257/376 |

FOREIGN PATENT DOCUMENTS

| 63-192268 | 8/1988 | Japan | H01L 27/08 |
|---|---|---|---|
| 2-264464 | 10/1990 | Japan | H01L 27/092 |

*Primary Examiner*—Mahshid Saadat
*Attorney, Agent, or Firm*—Hayes, Soloway, Hennessey, Grossman & Hage, P.C.

[57] ABSTRACT

A semiconductor device has an inherent region of the same conductivity type and the same impurity concentration as a semiconductor substrate and well regions located close to each other under a main surface of the semiconductor substrate. A field oxide film is selectively formed on the main surface. A MOSFET, termed an "undoped MOSFET," is formed in the inherent region. A carrier stop layer having a conductivity type opposite to, and an impurity concentration higher than, that of the inherent region is formed within the inherent region. The carrier stop layer extends from the bottom of the field oxide film and underlies the source/drain regions of the undoped MOSFET in spaced relationship therewith. The carrier stop layer prevents punch-through between the well region and densely diffused source/drain regions in the undoped MOSFET region, even when they are located close to each other. The present invention permits a higher density integration of elements or circuits in a semiconductor device to be achieved than is possible in the prior art.

9 Claims, 6 Drawing Sheets

PRIOR ART

FIG. 2(a) *PRIOR ART*
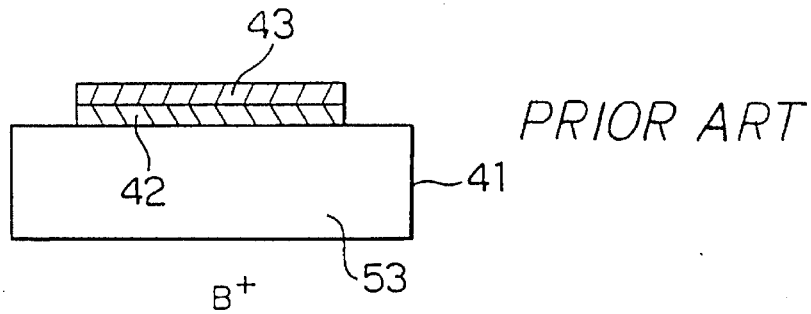
FIG. 2(b) *PRIOR ART*
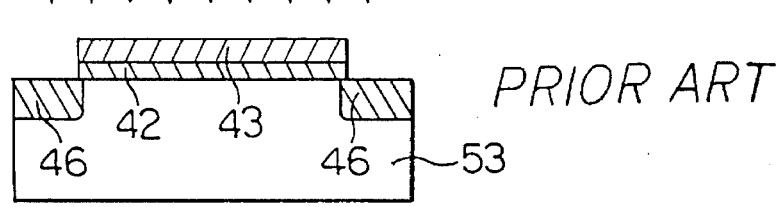
FIG. 2(c) *PRIOR ART*
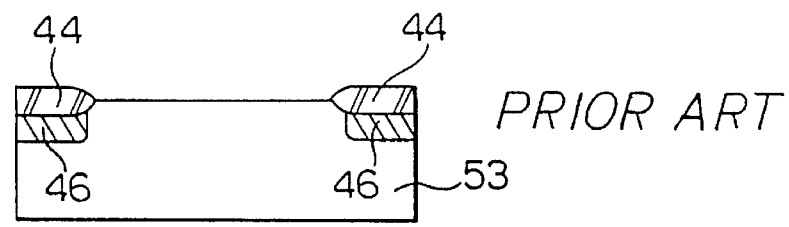
FIG. 2(d)
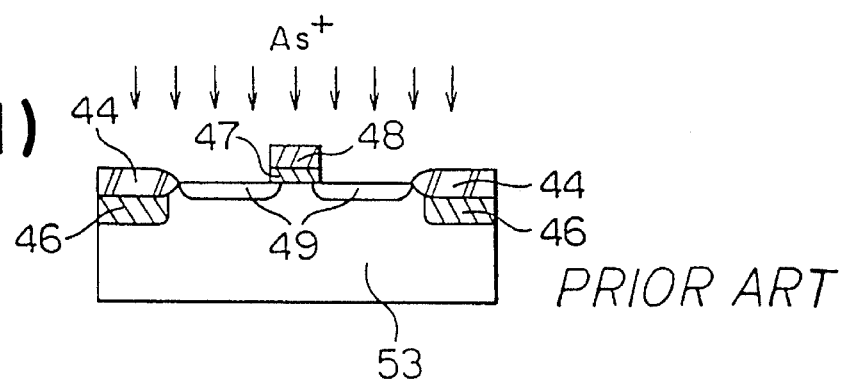
*PRIOR ART*

SEMICONDUCTOR DEVICE HAVING MOSFETS FORMED IN INHERENT AND WELL REGIONS OF A SEMICONDUCTOR SUBSTRATE

BACKGROUND OF THE INVENTION (a) Field of the Invention

The present invention relates to a semiconductor device, and more particularly to a semiconductor device having a MOSFET formed in an inherent region as well as a CMOSFET formed in well regions of a semiconductor substrate.

(b) Description of the Related Art

Some CMOSFET semiconductor devices are comprised of two MOSFETs formed in a P-well and an N-well of a semiconductor substrate, respectively, and a MOSFET formed in an inherent region of the same semiconductor substrate.

In the specification and the claims, the inherent region is defined as a region for forming a MOSFET, extending within the semiconductor substrate and having the same type of conductivity and the same impurity concentration as the semiconductor substrate. Further, the MOSFET formed in the inherent region is termed an undoped MOSFET for convenience hereinafter.

FIG. 1 is a sectional view of a conventional CMOSFET semiconductor device including an undoped MOSFET. As shown in FIG. 1, a P-well 51 for forming a MOSFET, an N-well 52 for forming another MOSFET, and an inherent region 53 for forming an undoped MOSFET are provided adjacent to each other under and including a main surface of a P-type semiconductor substrate 41.

A field oxide film 44 is selectively formed on the main surface of the semiconductor substrate 41 to separate the P-well 51, the N-well 52, and the inherent region 53 from each other. An $N^+$diffused-layer 49 is formed in the P-well 51 and the inherent region 53, and $P^+$diffused-layer 50 is formed in the N-well 52, respectively to provide source/drain regions.

In a P-type region just under the field oxide film 44, a $P^+$-type impurity layer 46 having a high impurity-concentration is formed as a channel stopper. A gate oxide film 47 and a gate electrode 48 thereon are provided on the main surface of the semiconductor substrate 41 for each of the MOSFETs.

The method of forming the undoped MOSFET will now be described with reference to FIGS. 2(a)–2(d) showing a sectional view of the undoped MOSFET in each process step.

First, as shown in FIG. 2(a), an oxide film 42 and then a nitride film 48 are formed on the surface of the inherent region 53 in the P-type semiconductor substrate 41. Then, the oxide film 42 and the nitride film 43 are patterned by means of a photolithographic technique and an etching technique so as to mask the inherent region 53. Next, as shown in FIG. 2(b), boron $B^+$ ions are implanted to form a $P^+$-type impurity layer 46. Then, as shown in FIG. 2(c), a field oxide film 44 is formed on the $P^+$-type impurity layer 46 by a thermal oxidation method.

In the next step, as shown in FIG. 2(d), after removing the nitride film 43 and then the oxide film 42, the gate oxide film 47 and the gate electrode 48 are formed by patterning. Then, arsenic $As^+$ ions are implanted, by using the gate oxide film 47 and gate electrode 48 as a mask, thereby forming $N^+$ diffused-layers 49 to provide source and drain regions with the inherent region.

According to the prior art illustrated in FIG. 1 and FIGS. 2(a)-2(d), the field oxide film 44 and the $P^+$-type impurity layer 46 are intended to perform element-to-element isolation for the undoped MOSFET.

By the way, in order to integrate elements or circuits with high integration density in a CMOSFET semiconductor device having such an undoped MOSFET as mentioned above, it is preferred to shorten the distance between the $N^+$diffused-layer and the N-well region adjacent thereto.

However, when it is attempted to shorten the distance in the conventional CMOSFET semiconductor device mentioned above, it causes a problem that when the undoped MOSFET is activated, a punch-through is likely to occur between the $N^+$diffused-layers of the undoped MOSFET and the N-well region adjacent thereto, resulting in that leakage current flowing into the N-well region remarkably increases.

SUMMARY OF THE INVENTION

In view of the foregoing, it is an object of the present invention to provide a highly integrated CMOSFET semiconductor device having undoped MOSFETs, wherein a punch-through is hard to occur between a diffused-layer of an undoped MOSFET and a well region adjacent thereto and thus leakage current flowing into the well region is reduced.

To attain this objective, a semiconductor device according to the present invention comprises a semiconductor substrate having an inherent region of a first conductivity type and a well region of a second conductivity type opposite to the first conductivity type, the well region having an impurity concentration higher than the impurity concentration of the inherent region, the semiconductor substrate having a main surface at the surfaces of the inherent region and the well region;

an insulating film selectively formed on the main surface and separating the inherent region from the well region;

a first MOSFET having a source and a drain regions in the inherent region;

a second MOSFET having a source and a drain regions in the well region; and a carrier stop layer having an impurity concentration higher than the impurity concentration of the inherent region and formed within the inherent region, the carrier stop layer extending from the vicinity of the bottom of the insulating film and underlying the source and drain regions of the first MOSFET in spaced relationship therewith.

In the present invention, firstly, the carrier stop layer is not in direct electrical contact with the source/drain and channel regions of the first MOSFET, termed the undoped MOSFET, because it underlies them in a spaced relationship therewith, extending From the vicinity of the bottom of the insulating film. Consequently, even when it has a high impurity concentration, the carrier stop layer scarcely permits conduction of carriers between the source/drain and channel regions of the undoped MOSFET and the well region adjacent thereto. Secondly, since the carrier stop layer is formed of a conductivity type opposite to the source/drain regions of the undoped MOSFET at a impurity concentration higher than the inherent region, it is capable of trapping carriers leaked from the source/drain and channel regions of the undoped MOSFET. Consequently, it prevents a punch-through from occurring between the source/drain and channel regions or the diffused-layer of the undoped MOSFET and the well region formed adjacent thereto, even when the diffused-layer is located close to the well region.

Therefore, according to the present invention, provided that a carrier stop layer defined as above is provided with the undoped MOSFET, the distance between the diffused-layers of the undoped MOSFET and the well region adjacent thereto can be made shorter than in a conventional CMOSFET, thereby resulting in a semiconductor device with a higher degree of integration density of integrated elements or circuits than is possible in the prior art.

BRIEF DESCRIPTION OF THE DRAWINGS

The above and other objects, features and advantages of the present invention will be more apparent from the following description, taking in conjunction with accompanying drawings in which:

FIGS. 2(a)–2(d) are sectional views of the inherent region at individual process steps in a method of manufacturing a conventional CMOSFET semiconductor device;

DESCRIPTION OF THE PREFERRED EMBODIMENTS

Figure 1:
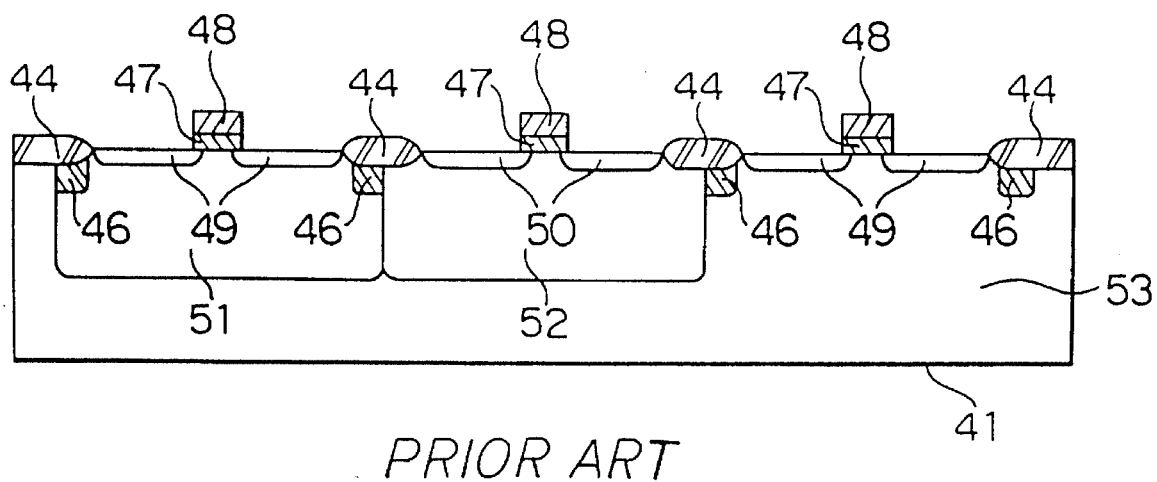
FIG. 1 is a sectional view of a conventional CMOSFET semiconductor device including undoped MOSFETs.
Figure 3:
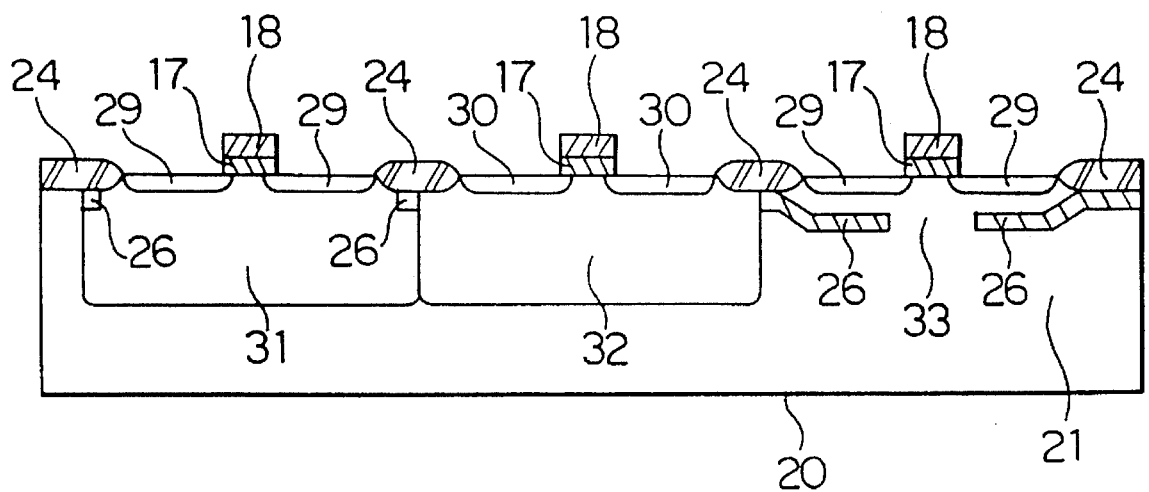
FIG. 3 is a sectional view showing MOSFETs in wells and an undoped MOSFET formed in an inherent region of a CMOSFET semiconductor device according to a first embodiment of the present invention.

The present invention will now be described with reference to the drawings. FIG. 3 is a sectional view of a CMOSFET semiconductor device, which is a first embodiment of the semiconductor device according to the present invention. As shown in FIG. 3, a semiconductor substrate 20 is of P-type conductivity and has an inherent region 21 of the same conductivity type and the same impurity concentration as the semiconductor substrate 20, an N-well region 32 located adjacent to the inherent region 21 and a P-well region 31 located adjacent to the N-well region 32 under and including a main surface thereof as viewed from the right side to the left side of FIG. 3. The impurity concentration of the N-well region 32 and the P-well region 31 is higher than the impurity concentration of the inherent region 21.

An insulating film, that is a field oxide film 24, is selectively formed on the main surface and separates the inherent region 21, the N-well region 32 and the P-well region 31 from each other. A MOSFET is formed in the inherent region 21, in the N-well region 32 and in the P-well region 31, respectively. A MOSFET formed in the inherent region 21 is called as an undoped MOSFET for convenience hereinafter. Each of the undoped MOSFET and the MOSFET in the P-well region 31 has source/drain regions formed by N$^+$diffused layers 29, and the MOSFET in the N-well region 32 has source/drain regions formed by P$^+$diffused layers 30. Each of MOSFETs has a gate oxide film 17 and a gate electrode 18 successively formed on the main surface.

Figure 5:
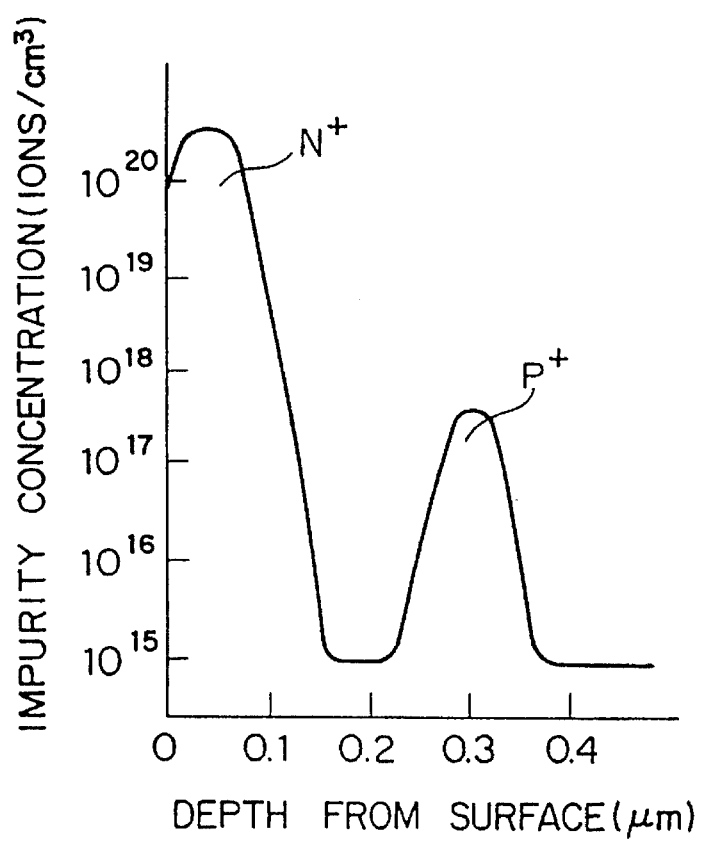
FIG. 5 is a graph showing an example of the distribution of impurity concentration in an inherent region of a semiconductor device to which the present invention is applied.

A carrier stop layer 26 having a P$^+$-type impurity concentration higher than the inherent region 21 is formed within the inherent region 21. It extends from the bottom of the field oxide film 24 and underlies the source/drain regions 29 of the undoped MOSFET in spaced relationship therewith, and has an opening 33 with an equivalent area to a channel region of the undoped MOSFET just thereunder. In the present embodiment, the impurity concentration of the carrier stop layer 26 is about $1 \times 10^{17}$–$1 \times 10^{18}$ ions/cm$^3$ as shown in FIG. 5, while the impurity concentration of the inherent region 21 is $1 \times 10^{15}$ ions/cm$^3$.

In such a structure, the P$^+$-type impurity carrier stop layer 26 prevents a punch-through between the N-well region 32 and the N$^+$diffused layer 29 in the undoped MOSFET, even when the undoped MOSFET is activated.

The process for forming the undoped MOSFET according to the above-mentioned embodiment is described as follows, with reference to FIGS. 4(a)–4(d), while the MOSFETs in the well regions are formed in accordance with a conventional method.

Figure 4A:
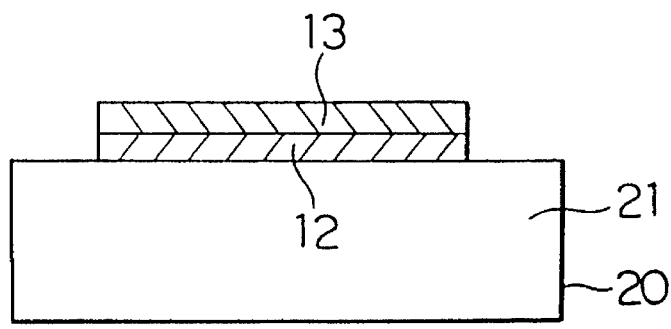
FIGS. 4(a)–4(d) are sectional views of an essential portion of a semiconductor device according to the first embodiment of the present invention at individual process steps.

First, as shown in FIG. 4(a), an oxide film 12 and a nitride film 13 are successively formed on the main surface of the P-type semiconductor substrate 20, then the oxide film 12 and the nitride film 13 are patterned by means of a photolithographic technique and an etching technique so as to mask the inherent region 21.

Figure 4B:
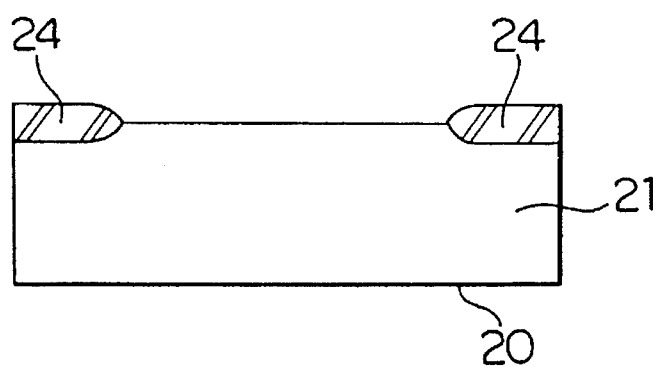

Next, as shown in FIG. 4(b), the field oxide film 24 is formed selectively on the main surface around the inherent region 21 by a thermal oxidation method to such a thickness, for example a thickness of about 3000 angstroms, that boron ions can penetrate the field oxide film 24 to form the P$^+$-type impurity layer 26 just thereunder. Then, the nitride film 13 and the oxide film 12 used as the mask are successively removed.

Figure 4C:
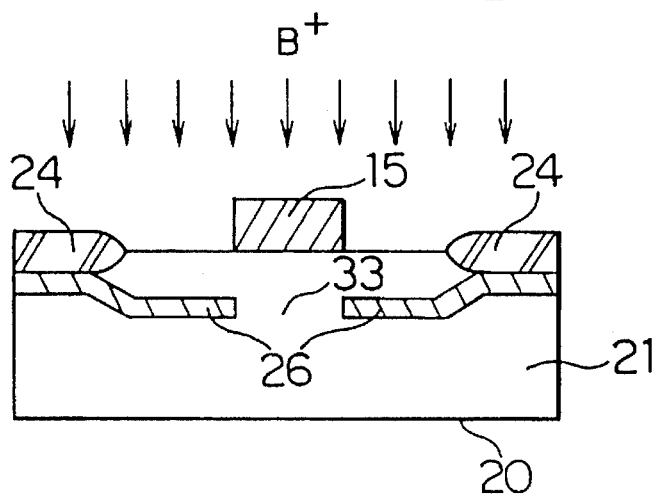

Next, as shown in FIG. 4(c), a photo resist layer 15 is formed to a predetermined pattern by using a photolithographic technique to mask a region for a channel. With the photo resist layer 15 being used as a mask, boron ions are implanted to form a P$^+$-type impurity carrier stop layer 26. The boron implantation is performed at such an acceleration energy that the ions penetrate the field oxide film 24 to form a P$^+$-type impurity layer 26 just thereunder and that the P$^+$-type impurity layer 26 is formed at a depth apart from N$^+$diffused-layers 29 to be formed later. In the case of the field oxide film 24 about 3000 angstroms thick, a preferable acceleration energy is approximately 110 keV and a preferable dosage is approximately $1.0 \times 10^{13}$ ions/cm$^2$.

As a result of this ion implantation, the carrier stop layer 26 extends from the bottom of the field oxide film 24 and underlies the source/drain regions 29 of the undoped MOSFET apart from them, but has an opening 33 with an equivalent area to the channel region just thereunder.

Figure 4D:
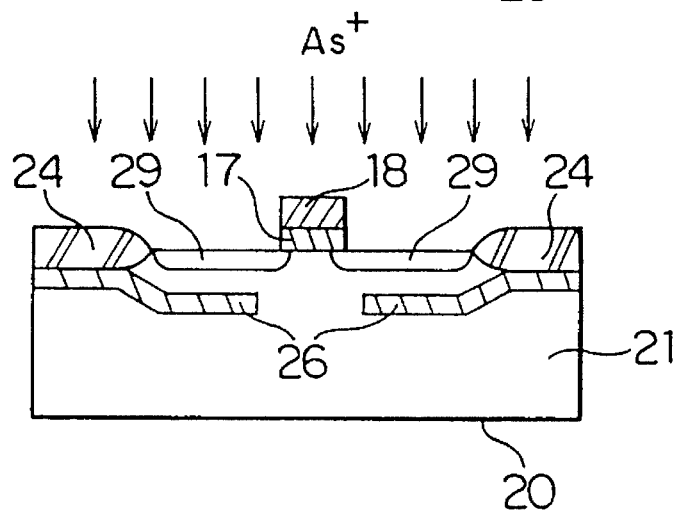

Subsequently, as shown in FIG. 4(d), the gate oxide film 17 and the gate electrode 18 are formed by patterning, then, with the gate oxide film 17 and the gate electrode 18 being used as a mask, arsenic ions are implanted down to a predetermined depth from the main surface of the semiconductor substrate 20 to form the N$^+$diffused-layers 29 as source/drain regions.

FIG. 5 is a graph showing the distribution of the impurity concentration of the inherent region in the direction of depth, thereby illustrating the relationship between a depth of the N⁺diffused source/drain regions 29 and a depth of the P⁺-type impurity carrier stop layer 26. In the graph, the depth (μm) from the surface of the inherent region is read along the axis of abscissa, and an impurity concentration (ions/cm³) is read along the axis of ordinate. The N⁺diffused source/drain regions 29 are formed from the surface of the P-type semiconductor substrate 20 down to a depth of about 0.15 μm, while the P⁺-type impurity carrier stop layer 26 is formed from a depth of about 0.25 μm down to a depth of about 0.4 μm.

Since the P⁺-type impurity carrier stop layer 26 is apart from, and thus is not in direct electrical contact with the N⁺diffused source/drain regions 29 and the channel region, it will not conduct carriers from the undoped MOSFET to the well region adjacent thereto, but will trap the carriers leaked from the undoped MOSFET to prevent them from flowing into the well region. Thus, punch-through through will not occur between the N⁺diffused-layers of the undoped MOSFET and the N-well adjacent thereto, thereby minimizing leakage current flowing into the N-well region.

Figure 6:
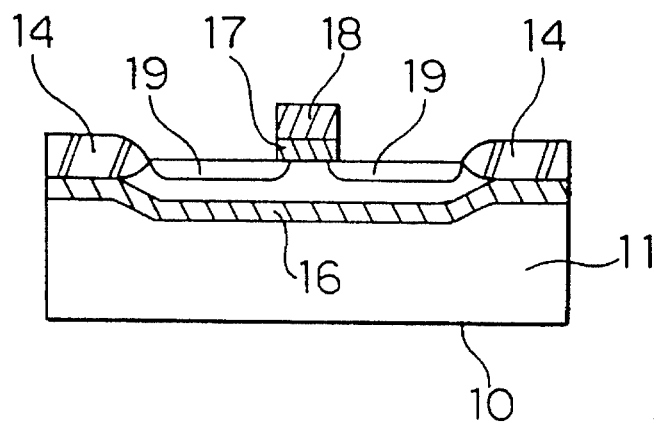
FIG. 6 is a sectional view of an essential portion of a semiconductor device according to a second embodiment of the present invention.

FIG. 6 is a sectional view of a semiconductor device according to a second embodiment of the present invention. In an undoped MOSFET of the present embodiment, a carrier stop layer 16 formed in an inherent region 11 of a semiconductor substrate 10 underlies source/drain regions 19 and a channel region from a bottom of a field oxide film 14 to a bottom of an opposite field oxide film 14 in the same way as the carrier stop layer 16 of the first embodiment, but does not have such an opening as provided in the carrier stop layer 16 of the first embodiment. The carrier stop layer 16 can perform the same function for stopping carriers as the carrier stop layer 16 in the first embodiment.

The process for forming the undoped MOSFET according to the second embodiment will be described below.

Instead of the steps of the first embodiment shown in FIGS. 4(c) and 4(d), boron ions are implanted into the inherent region 11 without masking a region for a channel with a photo resist layer, thereby forming a P⁺-type impurity carrier stop layer 16 having no opening under the channel region.

The boron implantation is performed at such an acceleration energy that ions penetrate the field oxide film 14 to form a P⁺-type impurity layer 16 just thereunder and that the P⁺-type impurity layer 16 is formed at such a depth apart from an N⁺diffused-layer 19 to be formed later so as not to electrically influence a channel region. For example, for the field oxide film 14 of 4000 angstroms thickness, boron ions are implanted at an acceleration energy of 150 keV and a dosage of $1.0 \times 10^{13}$/cm². In the next step, the source/drain regions 19, the gate oxide film 17 and gate electrode 18 are formed by the same way as the first embodiment.

As described above, in a semiconductor device according to each embodiment, by providing the carrier stop layer in the undoped MOSFET, punch-through will not occur between the N⁺diffused-source/drain regions of the undoped MOSFET and the N-well region adjacent thereto, even when they are located closer to each other than in a conventional semiconductor device. Consequently, the present embodiments will permit a high density integration of elements or circuits in a semiconductor device.

Figure 7:
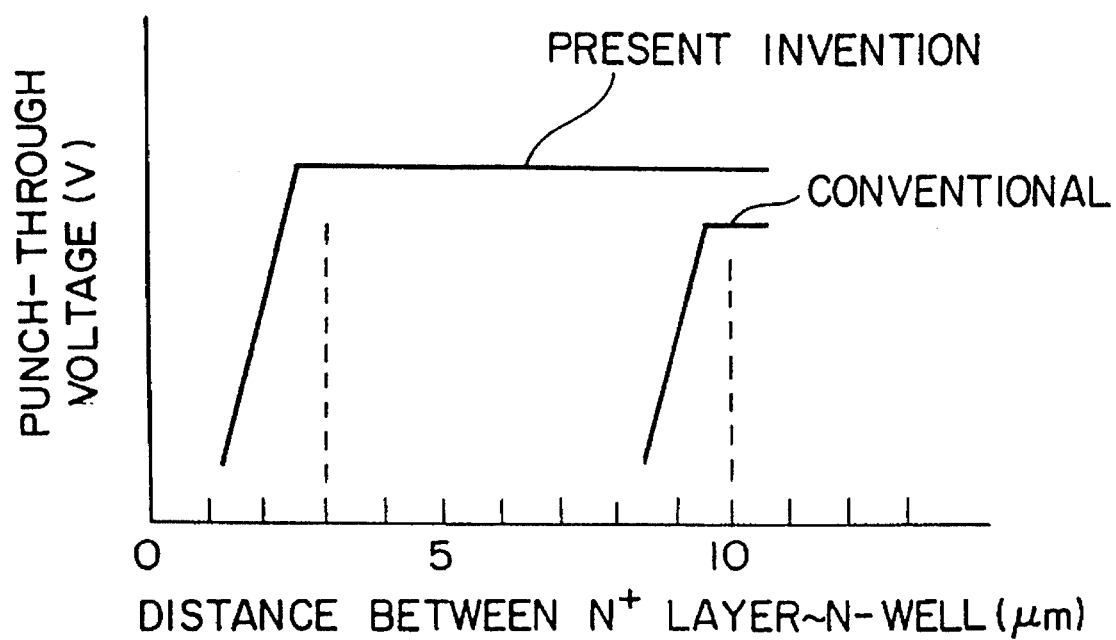
FIG. 7 is a graph showing the distance between an N-well and an N$^+$diffused layer in an undoped MOSFET vs. a punch-through voltage therebetween for illustrating an advantage of the present invention.

FIG. 7 is a graph illustrating advantages of the present invention by comparing characteristics of a sample semiconductor device according to the present invention and with those of a conventional semiconductor device. In the graph, the distance (μm) between an N⁺diffused layer in an inherent region and an N-well region adjacent thereto is read along the axis of the abscissa, and punch-through voltage (V) between the N⁺diffused layer and the N-well region is read along the axis of the ordinate. As seen from the figure, the distance required for separating the N⁺diffused layer in the undoped MOSFET and the N-well in the sample semiconductor device according to the present invention is reducible approximately to 3 μm, compared with the distance required for the conventional semiconductor device, i.e. approximately 10 μm, in view of the distance at which the punch-through voltage decreases in each of the curves. This proves that the present invention will permit a high density integration of elements or circuits in a semiconductor device.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor device comprising:

a semiconductor substrate having an inherent region of a first conductivity type and a well region of a second conductivity type opposite to said first conductivity type, said well region having an impurity concentration higher than the impurity concentration of said inherent region, said semiconductor substrate having a main surface at the surfaces of said inherent region and said well region;

an insulating film selectively formed on said main surface and separating said inherent region from said well region;

a first MOSFET having source and drain regions in said inherent region;

a second MOSFET having source and drain regions in said well region; and a carrier stop layer having an impurity concentration higher than the impurity concentration of said inherent region and formed within said inherent region, said carrier stop layer extending from the vicinity of the bottom of said insulating film and underlying said source and drain regions of the first MOSFET in spaced relationship therewith, said carrier stop layer having an opening opposite to a channel region of said first MOSFET.

2. A semiconductor device as defined in claim 1 wherein said insulating film divides said inherent region to form a plurality of MOSFET regions.

3. A semiconductor device as defined in claim 1 wherein said substrate further has a second well of said first conductivity type wherein a third MOSFET may be formed.

4. A semiconductor device as defined in claim 1, wherein said opening has an area at least equal to that of said channel region of said first MOSFET.

5. A semiconductor device as defined in claim 1, wherein said impurity concentration of said carrier stop layer is at least about 100 times greater than the impurity concentration of said inherent region.

6. A semiconductor device as defined in claim 1, wherein said carrier stop layer comprises two portions and said opening comprises a gap in-between said portions having an area that is substantially equal to an area of said channel region.

7. A semiconductor device as defined in claim 1, wherein said carrier stop layer is formed by implanting boron ions through said insulating film into said inherent region prior to formation of the source and drain regions of said first MOSFET.

8. A semiconductor device as defined in claim 1, wherein said source and drain regions of said first MOSFET extend from said main surface to a depth of about 0.15 microns beneath said main surface, and said carrier stop layer extends from a depth of about 0.25 microns to about 0.4 microns beneath said main surface in a region underlying said source and drain regions of said first MOSFET.

9. A semiconductor device as defined in claim 1, wherein said carrier stop layer is separated from said source and drain regions of said first MOSFET by a distance of about 0.1 microns.

* * * * *